(12) United States Patent
Wang et al.

(10) Patent No.: US 6,184,704 B1
(45) Date of Patent: Feb. 6, 2001

(54) DESIGN METHOD FOR COMPENSATION OF PROCESS VARIATION IN CMOS DIGITAL INPUT CIRCUITS

(75) Inventors: Hongwei Wang; Yu David Hu; Chan Chee Oei, all of Singapore (SG)

(73) Assignee: Tritech Microelectronics, Singapore (SG)

( * ) Notice: Under 35 U.S.C. 154(b), the term of this patent shall be extended for 0 days.

(21) Appl. No.: 09/246,294

(22) Filed: Feb. 8, 1999

(51) Int. Cl.$^7$ .............................................. H03K 19/0185
(52) U.S. Cl. .................... 326/34; 326/24; 326/83
(58) Field of Search .................. 326/31–34, 83, 326/121, 22–23, 24

(56) References Cited

U.S. PATENT DOCUMENTS

| | | | |
|---|---|---|---|
| 4,578,600 | * 3/1986 | Magee | 326/34 |
| 4,806,801 | * 2/1989 | Argade et al. | 326/34 |
| 4,975,599 | 12/1990 | Petrovick, Jr. et al. | |
| 5,111,081 | 5/1992 | Attallah . | |
| 5,175,445 | * 12/1992 | Kinugasa et al. | 326/34 |
| 5,179,298 | * 1/1993 | Hirano et al. | 326/83 |
| 5,416,366 | * 5/1995 | Adachi | 326/33 |
| 5,434,532 | 7/1995 | Thiel | 327/531 |
| 5,602,496 | * 2/1997 | Mahmood | 327/206 |
| 5,959,473 | * 9/1999 | Sakuragi | 326/33 |

OTHER PUBLICATIONS

Hisano, U.S. Statutory Invention Registration H802, Jul. 1990.*

* cited by examiner

*Primary Examiner*—Jon Santamauro
(74) *Attorney, Agent, or Firm*—George O. Saile; Stephen B. Ackerman

(57) ABSTRACT

This invention describes an improved design of CMOS. digital input circuits. This improvement reduces the switching level uncertainty range and thus increases the noise margin, compensating for manufacturing process variations. This improvement is achieved by providing resistive compensation devices in series with the P-type and the N-type CMOS transistors in the first stage of a multistage digital input circuit. These resistive devices can be implemented by means of resistors or by means of MOSFET devices which provide the required resistive function. These compensation devices modify the input-output voltage transfer characteristics of the first stage so as to reduce the switching level variation at the input to the circuit. The resulting digital input circuit has a greater tolerance to input noise levels. The improvement provided by this invention is particularly important as integrated circuits design trend is to operate with lower supply voltages.

8 Claims, 3 Drawing Sheets

DESIGN METHOD FOR COMPENSATION OF PROCESS VARIATION IN CMOS DIGITAL INPUT CIRCUITS

FIELD OF THE INVENTION

This invention relates to CMOS (Complementary Metal Oxide Semiconductor) digital input circuits with compensation for manufacturing process variation as it affects circuit characteristics.

BACKGROUND OF THE INVENTION

A basic digital input circuit contains two or more chained inverter stages. In order to guarantee enough tolerance to noise, an input low voltage, Vil, and an input high voltage, Vih, switch levels at the input are specified. Modern integrated circuit requirements have pushed the two specifications closer and closer. For example, in current digital circuits using a 3.3V supply voltage, Vdd, one often finds Vil=0.3 Vdd and Vih=0.4 Vdd, resulting in a window of 0.1 Vdd which is only 0.33V.

However, the variation of the integrated circuit manufacturing process may introduce a shift in the input switching voltage level, or toggle voltage, Vtgl. We define the toggle voltage, Vtgl, as the input voltage at which the output voltage of an inverter chain is equal to 0.5 Vdd. The purpose of defining Vtgl is as the input voltage sweeps, the output of an inverter changes very steeply when flipping from one state to another state. The extent of the Vtgl variation range is mainly dependent on manufacturing process variations. Its magnitude must lie within the Vil and Vih range. The manufacturing process variation, therefore, reduces the noise margin of the whole circuit.

Three US patents are known which deal with the subject of circuit compensation for manufacturing process variation.

U.S. Pat. No. 5,111,081 (Atallah) provides a CMOS inverter in which variations in process are compensated for by varying the W/L ratio of the inverter FET devices by means of switching in selected other FETs in parallel with the inverter FET devices.

U.S. Pat. No. 4,975,599 (Petrovick, Jr. et al.) provides a technique for compensating for process variation in CMOS driver circuits using 5-transistor compensation circuits for control of each output device in the driver. In this patent the compensation is intended to stabilize the speed of operation of the driver.

U.S. Pat. No. 5,434,532 (Thiel) discloses a voltage reference circuit including CMOS devices for compensation of process variation in transistor circuits.

SUMMARY OF THE INVENTION

The object of the present invention is to provide an improved design of CMOS digital input circuits when manufacturing process variations change the operational characteristics of the individual transistor elements in the circuit.

Another object of this invention is to provide an integrated CMOS digital input circuit whose operation has a reduced sensitivity to manufacturing process variations.

Another object of this invention is to provide an integrated CMOS digital input circuit which can tolerate the presence of larger noise levels.

Another object of this invention is to provide an integrated CMOS digital input circuit which has an increased tolerance of smaller input voltage margins resulting from lower supply voltage.

Another object of this invention is the increased ability of an integrated CMOS digital input circuit to operate reliably with a low voltage supply when manufacturing process variations reduce the input voltage margins.

These objects have been achieved by providing resistive compensation devices in series with the P-type and the N-type CMOS transistors in the first stage of a multistage digital input circuit. These resistive devices can be implemented by means of resistors or by means of MOSFET devices which provide the required resistive function. The preferred embodiment uses the MOSFET implementation of the resistive devices. The function of the resistive compensating devices is to change the transfer function of the first stage so as to reduce the excursion of input voltage switching levels resulting from manufacturing process variations, thereby reducing the switching uncertainty range and increasing the noise margin of the input circuit.

The present invention is applicable to different types of integrated CMOS multistage input circuits. The preferred embodiments describe two possible implementations, one being a multistage CMOS inverter chain where the first stage is an inverter, and the other using a Schmitt trigger as the first stage of the inverter chain.

FIG, 4 shows a plot of the output of a digital input circuit vs. input to the second stage and the effect of process variation on this transfer curve.

Figure 5A:
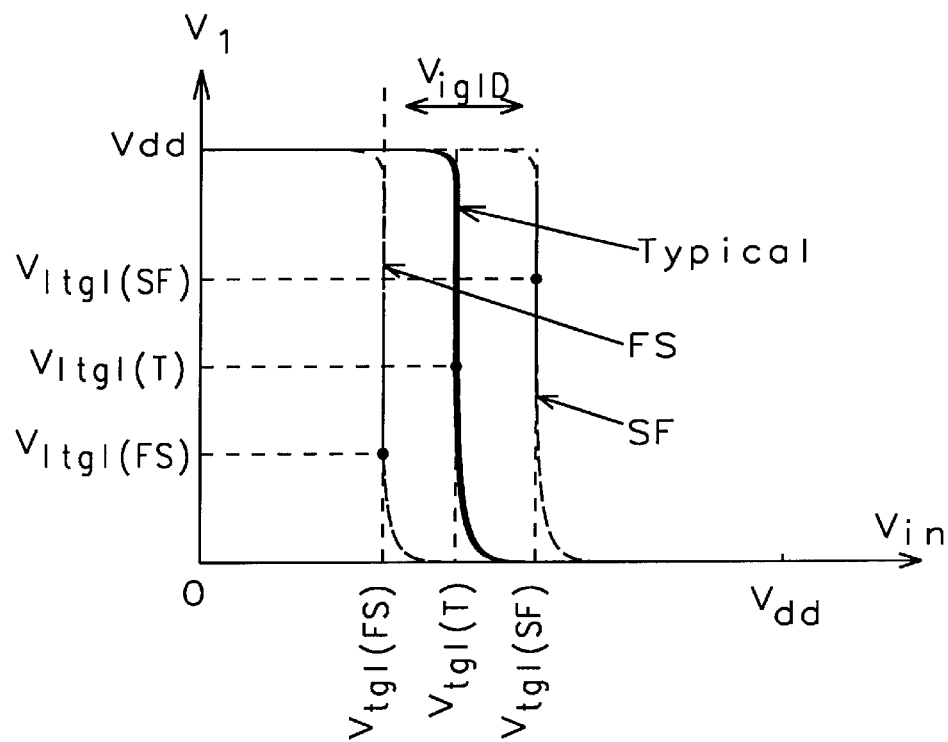

FIG. 5a shows the effect of process variation on the transfer curve of the first stage inverter of a digital input circuit.

Figure 5B:
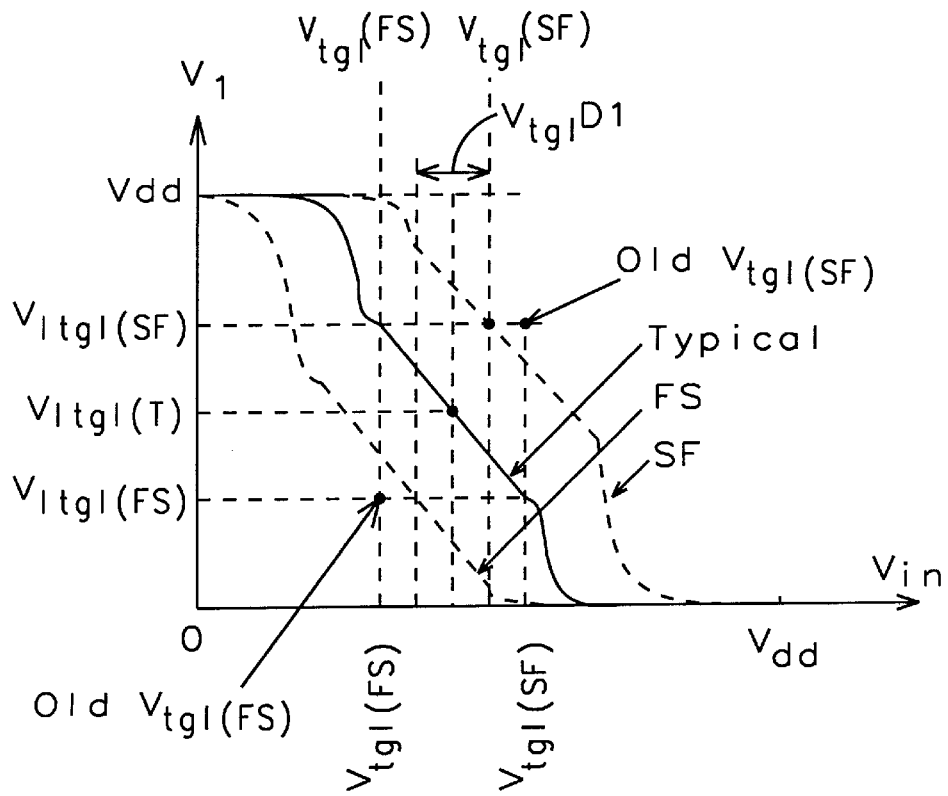

FIG. 5b shows the transfer curve of the first stage inverter of a digital input circuit with compensation and the resulting reduction in switching uncertainty.

DESCRIPTION OF PREFERRED EMBODIMENTS

Figure 1:
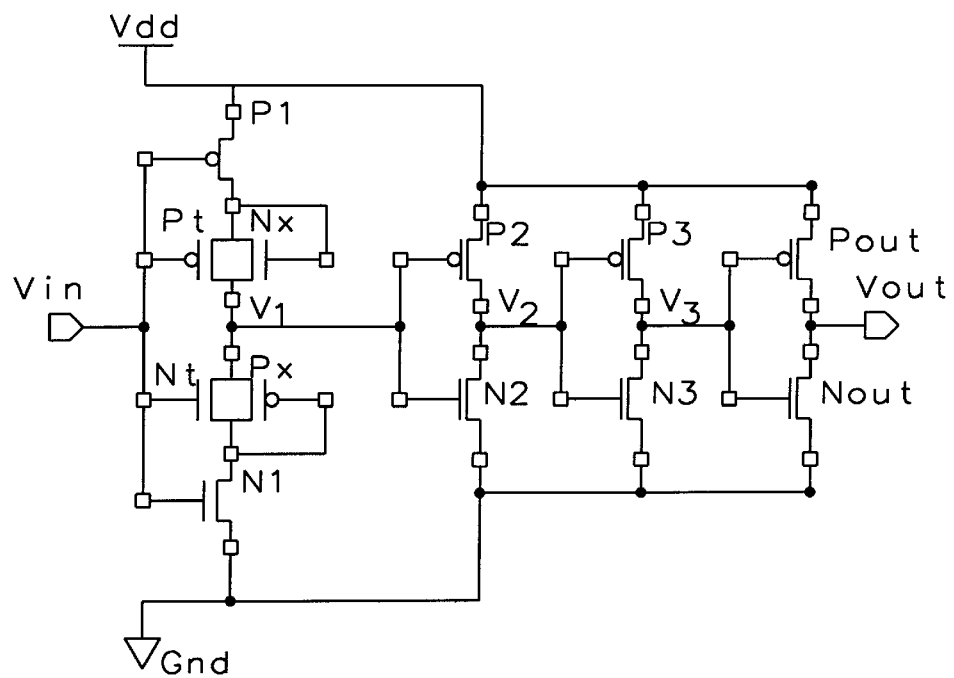
FIG. 1 shows a digital input circuit inverter chain using MOSFET devices in the first stage to compensate for process variations.

FIG. 1 is a schematic diagram of a multistage digital input circuit where each stage is a CMOS inverter and the first stage has been modified to provide compensation for manufacturing process variations. In this circuit, the compensation is implemented using MOSFET (Metal Oxide Silicon Field Effect Transistor) resistive devices which are inserted in series with the basic P1 and N1 inverter transistors. Two resistive compensation elements are used. A first resistive element, Nx, is comprised of an N-type FET (Field Effect Transistor) and the second resistive element, Px, is comprised of a P-type FET. The drain and gate of transistor Nx are connected to each other (transistor Nx is drain and gate shorted) and the drain and gate of transistor Px are connected to each other (transistor Px is drain and gate shorted). The drain-gate connection of said transistors Nx and Px provides the desired resistive function. The drain of Px is connected to the drain of CMOS transistor P1 and the drain of Px is connected to the drain of CMOS transistor N1. The source of transistor Nx and the source of transistor Px are connected to the output node, V1, of stage 1. The source of CMOS transistor P1 is connected to supply voltage, Vdd, and the source of CMOS transistor N1 is connected to ground. The gate of transistor P1 and the gate of transistor N1 are connected to the digital input circuit input node, Vin.

The compensation scheme of the first stage of the digital input circuit includes an additional P-type transistor, Pt, connected in parallel with transistor Nx and an additional N-type transistor, Nt, in parallel with transistor Px. The source of transistor Pt is connected to the drain of transistor P1 and the drain of transistor Pt is connected to output node V1. The source of transistor Nt is connected to the drain of transistor N1 and the drain of transistor Nt is connected to output node V1. The gates of transistors Pt and Nt are connected to input node Vin.

Transistors Nx and Px cause a voltage threshold loss at the output voltage in the first stage of the digital input circuit. Transistors Pt and NT connected in parallel with said transistors Nx and Px respectively tend to eliminate this voltage threshold loss.

The addition of transistors Nx and Px to the inverter circuit as shown in FIG. 1 is basic to this invention. Said transistors are gate drain shorted and, therefore, act as resistive elements in series with the inverter transistors P1 and N1 respectively. An alternative connection of said transistors where the gate of transistor Nx is not connected to its drain but is connected to another voltage higher than its source and the gate of transistor Px is not connected to its drain but is connected to another voltage lower than its source also applies to this invention. The addition of transistors Nx and Px modifies the transfer curves of the first stage of the inverter such as to reduce the switching uncertainty range of the circuit, caused by variations in the manufacturing process. This is further illustrated in FIG. 3, FIG. 4, and FIG. 5.

Figure 3:
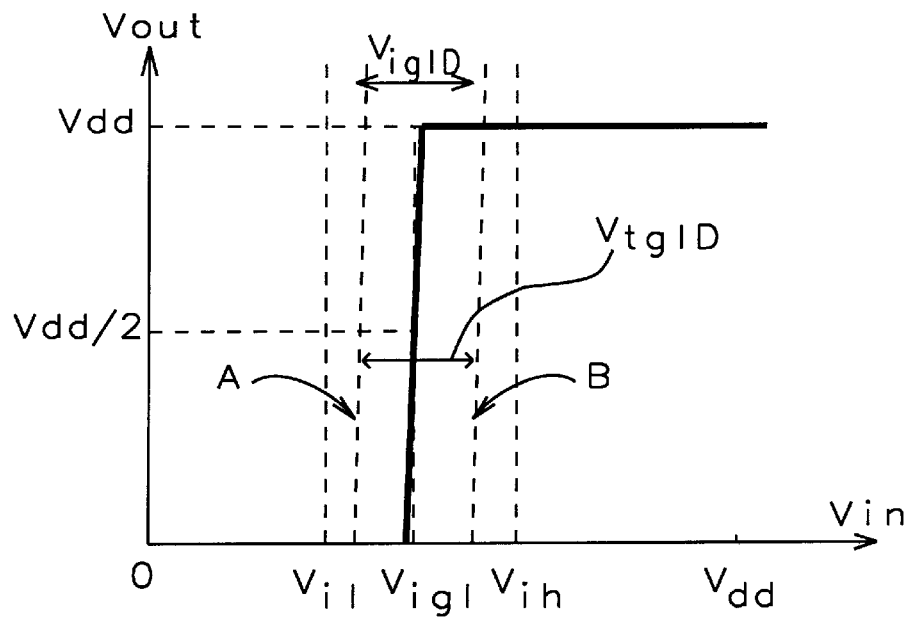
FIG. 3 represents the transfer curves which show the noise margin reduction due to process variation in the digital input circuit with no compensation.

FIG. 3 illustrates the transfer curves showing the noise margin reduction due to process variation in the said digital input circuit. The toggle voltage, Vtgl, is the input voltage at which the output voltage of the digital input circuit is 0.5 Vdd. Vil is the specification for the most positive low voltage input to the circuit and Vih is the specification for the least positive high voltage input to the circuit. One can see in FIG. 3 that there were no manufacturing process variations, the circuit would have maximum noise tolerance. The noise tolerance or noise margin is defined as Vil to Vtgl at the lower end and Vih to Vtgl at the higher end. However, manufacturing process variations cause the toggle voltage to shift from nominal in the direction of lower or higher voltage level creating an uncertainty range, VtglD. Generally, in an operational circuit, the uncertainty range, VtglD, is contained within the range of Vil to Vih. As shown in FIG. 3, manufacturing process variations can cause Vtgl to exist anywhere between transfer curve A and transfer curve B. Clearly, the noise margin which is the voltage range of Vil to A at the lower end, and the voltage range of Vih to B at the higher end is reduced as the result of manufacturing process variations.

Figure 4:
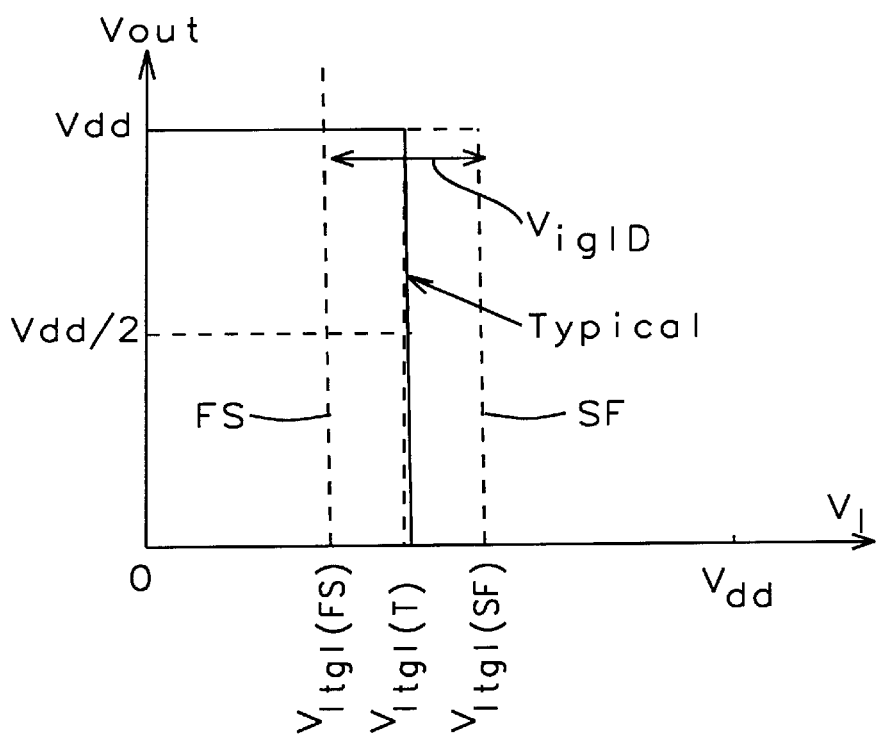

FIG. 4, FIG. 5a and FIG. 5b are used to illustrate the principle of this invention:

FIG. 4 shows the transfer curves of Vout (the voltage output of the digital input circuit) vs. V1 (the output of the first stage and input to the rest of the digital input circuit). Transfer curves are shown for three V1 toggle voltages: V1tgl(T) which is the switching voltage level for typical or nominal NMOS and PMOS process; V1tgl(FS) which represents fast NMOS and slow PMOS; V1tgl(SF) which represents slow NMOS and fast PMOS. V1tgl(FS) and V1tgl(SF) are the two extreme shifts in V1tgl due to manufacturing process variation. Clearly, V1tgl(FS), V1tgl(T) and V1tgl(SF) are unaffected by the addition of compensation in stage one.

FIG. 5a shows the transfer curves of the first stage of the digital input circuit without compensation for manufacturing process variation. Three transfer curves are shown: V1 vs. Vin for FS, typical and SF cases respectively. For each case, the Vin voltage at the intersection point of the transfer curve with V1tgl is the toggle voltage for the whole digital input circuit. The three values of Vtgl of FIG. 4 are shown in FIG. 5a: Corresponding to Vtgl(FS) is the V1 voltage V1tgl(FS), corresponding to Vtgl(T) is the V1 voltage V1tgl(T) and corresponding to Vtgl(SF) is the V1 voltage V1tgl(SF).

FIG. 5b illustrates the effect of compensation resistive devices, Px and Nx, of FIG. 1 on the transfer curves of the first stage of the digital input circuit. As a result of the compensation devices the transfer curves are rotated producing a less steep slant in the vicinity of toggle voltages, thus bringing closer to each other the values of Vtgl(FS) and Vtgl(SF). The resulting VtglD1 is smaller than VtglD prior to compensation and consequently, the uncertainty range of the circuit is reduced. The noise margin of the digital input circuit is correspondingly increased.

Transistors Nx and Px provide an additional function. As shown in FIG. 1, Nx is an N-type transistor in series with a P-type transistor, P1, and Px is a P-type transistor in series with an N-type transistor, N1. This combination of a P-type transistor with an N-type transistor tends to compensate for manufacturing process variations. This action additionally helps to reduce the Vtgl excursions due to manufacturing process variations.

The principle of this invention illustrated in FIG. 5b would also apply if the compensating resistive devices were resistors instead of MOSFET devices. However the use of resistors reduces the current driving capability of the first stage inverter and, therefore, the preferred embodiment emphasizes the use of MOSFET compensating resistive devices.

Figure 2:
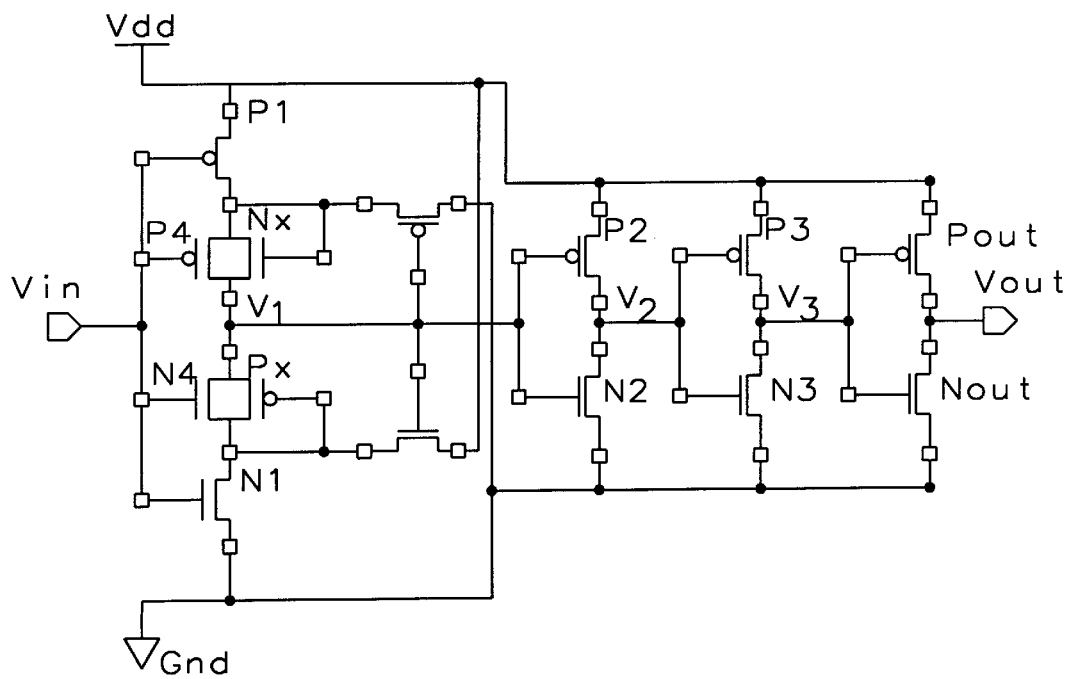
FIG. 2 shows a multistage digital input circuit with a Schmitt trigger as the first stage using MOSFET devices to compensate for process variations.

FIG. 2 illustrates the application of this invention to a multistage digital input circuit which uses a Schmitt trigger in its first stage. The functions of transistors P1, N1, Nx, Px are the same as described above. The threshold loss compensation function of transistors Pt and Nt shown in the inverter circuit of FIG. 1 are provided respectively by transistor P4 and N4 which are already included in the structure of the Schmitt trigger circuit without compensation.

While the invention has been particularly shown and described with reference to the preferred embodiments thereof, it will be understood by those skilled in the art that various changes in form and details may be made without departing from the spirit and scope of the invention.

What is claimed is:

1. A digital input circuit consisting of multiple inverter stages where the first stage is an inverter which contains a compensation means for lessening the effect of manufacturing process variations on the switching voltage level at the input of said digital input circuit, said compensation means being such that said digital input circuit is capable of operating at low voltage; said first stage is comprised of a first P-type FET transistor, a first compensating resistive device, a second N-type FET transistor and a second compensating resistive device, the input to said first stage is connected to the gates of said FET transistors, the source of said first FET device is connected to the supply voltage, said first compensating resistive device has one terminal connected to the drain of said first FET transistor and the other terminal of said first compensating resistive device is connected to the output node of said first stage, the source of said second FET device is connected to ground, said second compensating resistive device has one terminal connected to the drain of said second FET transistor and the other terminal of said second compensating resistive device is connected to the output node of said first stage.

2. A digital input circuit of claim 1, wherein the first compensating resistive device and the second compensating resistive device provide the means to shift the input voltage switch level to compensate for the shift of input voltage switch level caused by manufacturing process variations thereby reducing the effect of said manufacturing process variations.

3. A digital input circuit of claim 1, where the said compensating resistive devices are comprised of MOSFET devices, the first compensating resistive device is an N-type FET with drain and gate shorted, the drain of said first compensating device is connected to the drain of the first P-type FET transistor, the source of said first compensating device is connected to the output node of said first stage, the second compensating resistive device is a P-type FET with drain and gate shorted, the drain of said second compensating device is connected to the drain of the second N-type FET transistor, the source of said second compensating device is connected to the output node of said first stage of the digital input circuit.

4. A digital input circuit of claim 1 where the said compensating resistive devices are comprised of MOSFET devices, the first compensating resistive device is an N-type FET with the gate connected to a voltage higher than the source of said device, the drain of said first compensating device is connected to the drain of the first P-type FET transistor, the source of said first compensating device is connected to the output node of said first stage, the second compensating resistive device is a P-type FET with the gate connected to a voltage lower than the source of said device, the drain of said second compensating device is connected to the drain of the second N-type FET transistor, the source of said second compensating device is connected to the output node of said first stage of the digital input circuit.

5. A digital input circuit of claim 3 wherein;
 a P-type transistor is connected in parallel with said first compensating N-type FET to compensate for the threshold loss due to said compensating N-type FET, the gate of said P-type transistor is connected to the said first stage input node, the drain is connected to the drain of said compensating N-type FET and the source is connected to the source of the said compensating N-type FET;
 an N-type transistor is connected in parallel with said second compensating P-type FET to compensate for the threshold loss due to said compensating P-type FET, the gate of said N-type transistor is connected to the said first stage input node, the drain is connected to the drain of said compensating P-type FET and the source is connected to the source of said compensating P-type FET.

6. A digital input circuit consisting of multiple stages wherein the first stage is a Schmitt trigger circuit which contains a compensation means for lessening the effect of manufacturing process variations on the switching voltage level at the input of said digital input circuit, said compensation means being such that said digital input circuit is capable of operating at low voltage; wherein the first stage Schmitt trigger circuit is comprised of:
 a first P-type transistor and second P-type transistor connected in series;
 a connection from the source of the first P-type transistor to the supply voltage;
 a connection from the drain of the first P-type transistor to the source of the second P-type transistor;
 a connection from the drain of the second P-type transistor to the output node of first stage;
 a feedback loop connected from the drain of the first P-type transistor to the output node;
 a compensating N-type drain-gate shorted FET connected in parallel with the second P-type transistor where the source of said N-type FET is connected to the drain of said second P-type transistor and the drain of said N-type FET is connected to the source of said second P-type transistor;
 a first N-type transistor and second N-type transistor connected in series;
 a connection from the source of the first N-type transistor to ground;
 a connection from the drain of the first N-type transistor to the source of the second N-type transistor;
 a connection from the drain of the second N-type transistor to the output node of first stage;
 a feedback loop connected from the drain of the first N-type transistor to the output node;
 a compensating P-type drain gate shorted FET connected in parallel with the second N-type transistor where the source of said P-type FET is connected to the drain of said second N-type transistor and the drain of said P-type FET is connected to the source of said second N-type transistor.

7. A digital input circuit of claim 6 wherein the compensating P-type FET and the compensating N-type FET provide the means to shift the input voltage switch level to compensate for the shift of input voltage switch level caused by manufacturing process variations thereby reducing the effect of said manufacturing process variations.

8. A digital input circuit of claim 6 wherein said first compensating N-type FET offsets the variation of said series connected P-type transistors resulting from manufacturing process variations and wherein said second compensating P-type FET offsets the variation of said series connected N-type transistors resulting from manufacturing process variations.

\* \* \* \* \*